United States Patent
Yaguchi et al.

(10) Patent No.: US 9,754,762 B2
(45) Date of Patent: Sep. 5, 2017

(54) ELECTRON MICROSCOPE AND SAMPLE OBSERVATION METHOD

(71) Applicant: HITACHI HIGH-TECHNOLOGIES CORPORATION, Tokyo (JP)

(72) Inventors: Toshie Yaguchi, Tokyo (JP); Hiroyuki Kobayashi, Tokyo (JP); Takafumi Yotsuji, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/322,659

(22) PCT Filed: Jun. 8, 2015

(86) PCT No.: PCT/JP2015/066424
§ 371 (c)(1),
(2) Date: Dec. 28, 2016

(87) PCT Pub. No.: WO2016/006375
PCT Pub. Date: Jan. 14, 2016

(65) Prior Publication Data
US 2017/0133195 A1    May 11, 2017

(30) Foreign Application Priority Data

Jul. 7, 2014    (JP) ................. 2014-139273

(51) Int. Cl.
*H01J 37/22*   (2006.01)
*H01J 37/20*   (2006.01)
(Continued)

(52) U.S. Cl.
CPC .............. *H01J 37/22* (2013.01); *H01J 37/20* (2013.01); *H01J 37/244* (2013.01); *H01J 37/28* (2013.01);
(Continued)

(58) Field of Classification Search
USPC ......................................... 250/311, 306, 307
See application file for complete search history.

(56) References Cited

U.S. PATENT DOCUMENTS

| | | | | |
|---|---|---|---|---|
| 5,179,280 A | * | 1/1993 | Wang | H01J 37/20 250/307 |
| 2010/0108882 A1 | * | 5/2010 | Zewail | H01J 37/22 250/307 |

FOREIGN PATENT DOCUMENTS

| | | |
|---|---|---|
| JP | 2010-212067 A | 9/2010 |
| JP | 2011-181393 A | 9/2011 |
| JP | 2013-101791 A | 5/2013 |

OTHER PUBLICATIONS

International Search Report, dated Jul. 14, 2015, which issued during the prosecution of International Application No. PCT/JP2015/066424, which corresponds to the present application.

* cited by examiner

*Primary Examiner* — Kiet T Nguyen
(74) *Attorney, Agent, or Firm* — Baker Botts L.L.P.

(57) ABSTRACT

Provided are a device and a method allowing a crystal orientation to be adjusted with adequate throughput and high precision to observe a sample, regardless of the type of the sample or the crystal orientation. In the present invention, the method comprises: setting a fitting circular pattern (26) displayed overlaid so that a main spot (23) is positioned on the circumference thereof, on the basis of the diffraction spot brightness distribution in an electron diffraction pattern (22b) displayed on a display unit (13); setting a vector (28) displayed with the starting point at the center position (27) of the displayed circular pattern (26), and the end point at the location of the main spot (23) positioned on the circumfer-
(Continued)

ence of the circular pattern (26); and adjusting the crystal orientation on the basis of the orientation and the magnitude of the displayed vector (28).

9 Claims, 11 Drawing Sheets

(51) Int. Cl.
 *H01J 37/244* (2006.01)
 *H01J 37/28* (2006.01)
(52) U.S. Cl.
 CPC ................ *H01J 2237/20207* (2013.01); *H01J 2237/2802* (2013.01)

[Fig. 1]
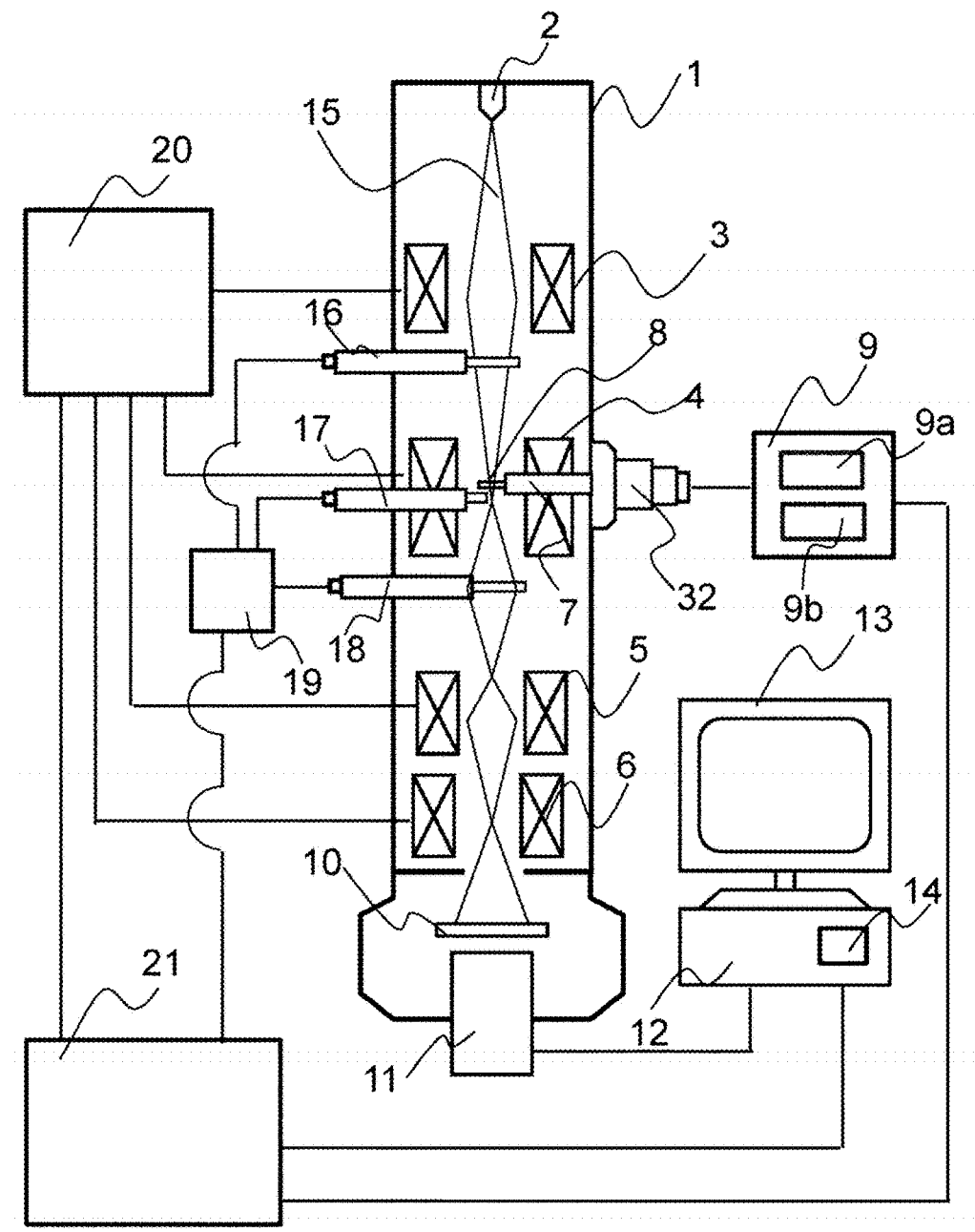

[Fig. 2]
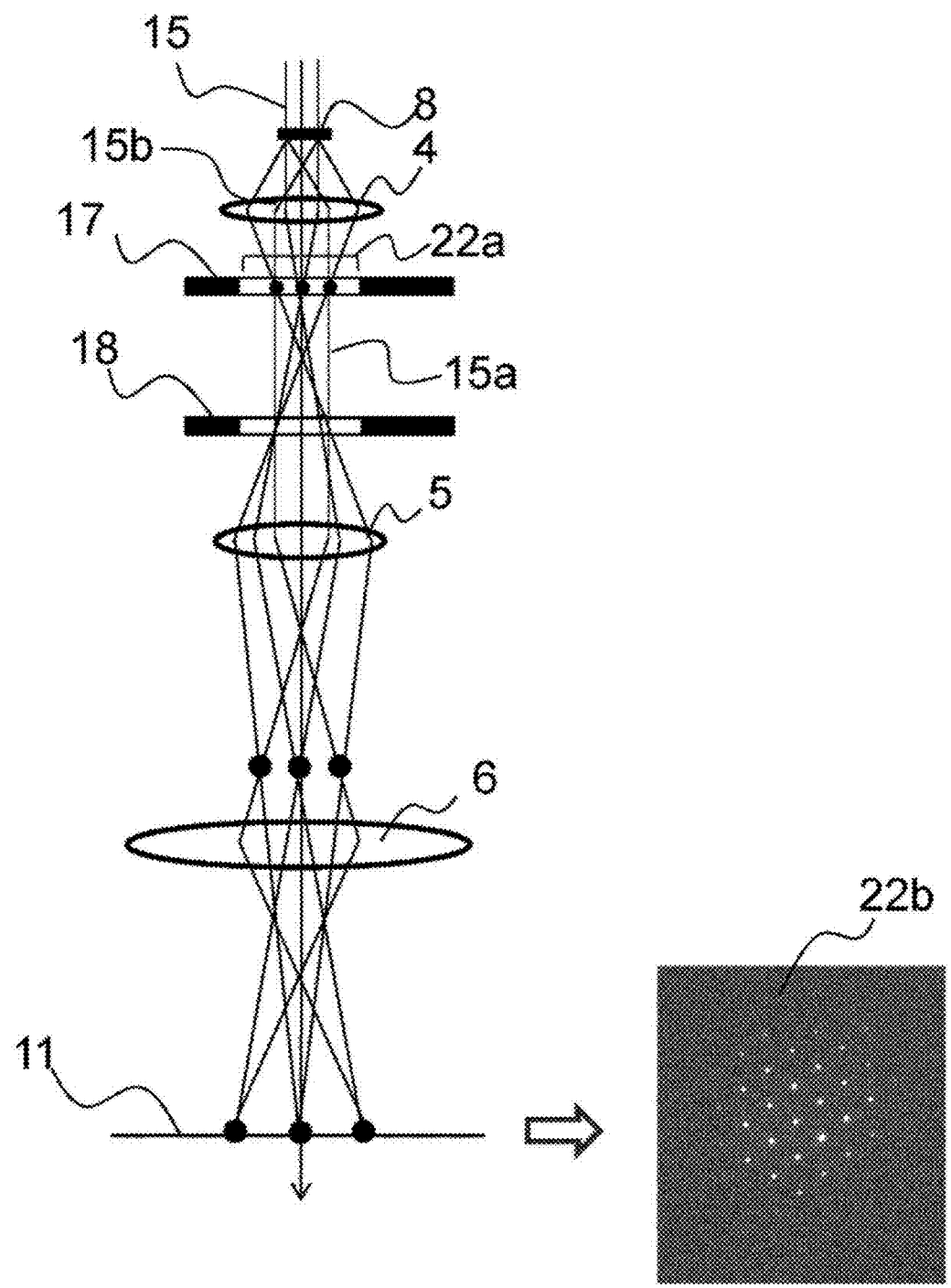

[Fig. 3A]  [Fig. 3B]
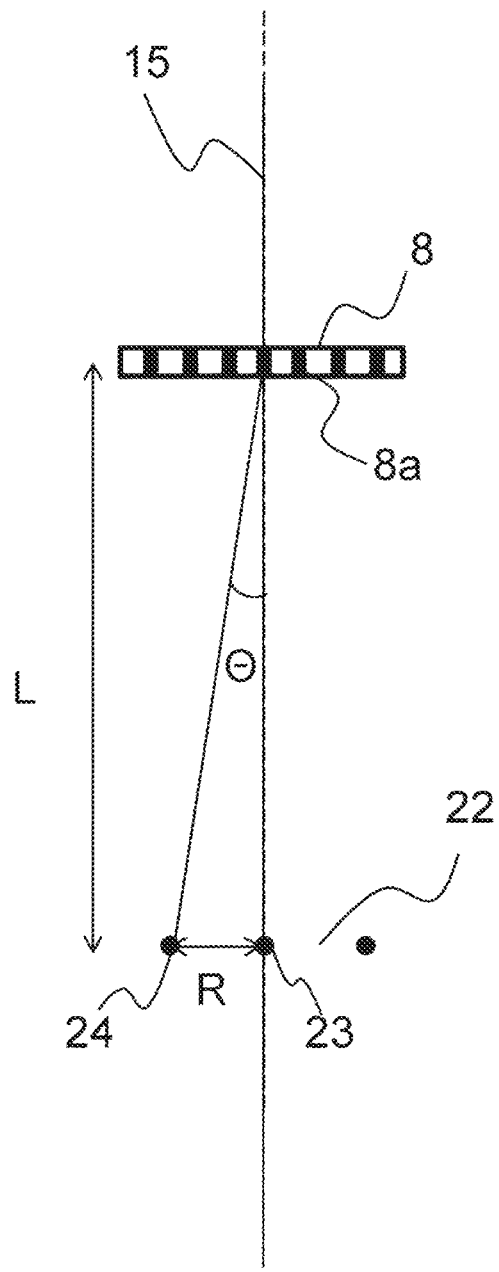 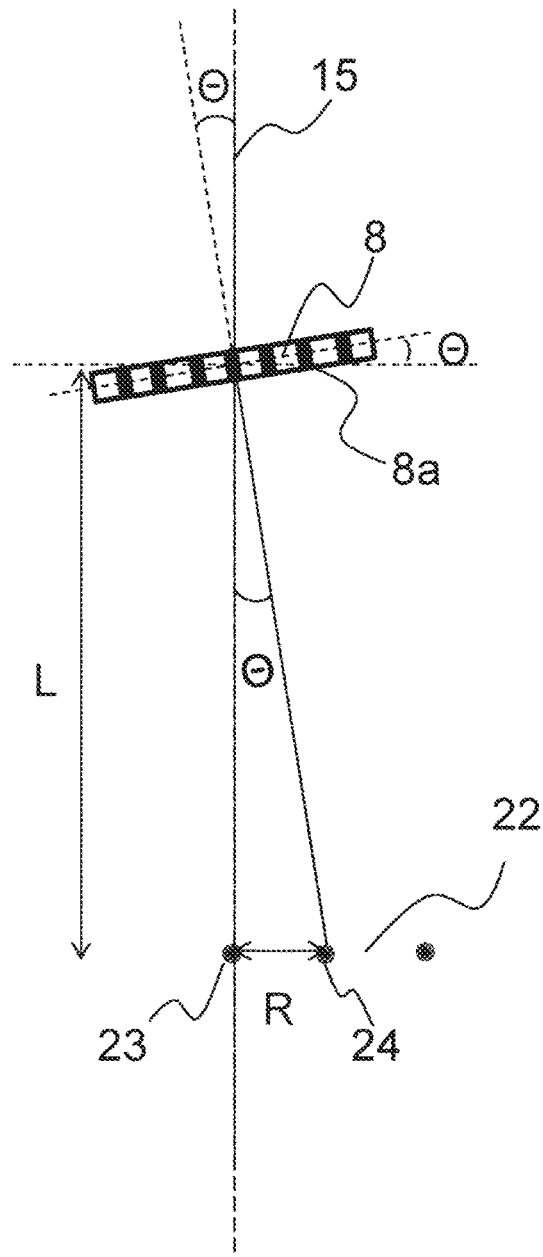

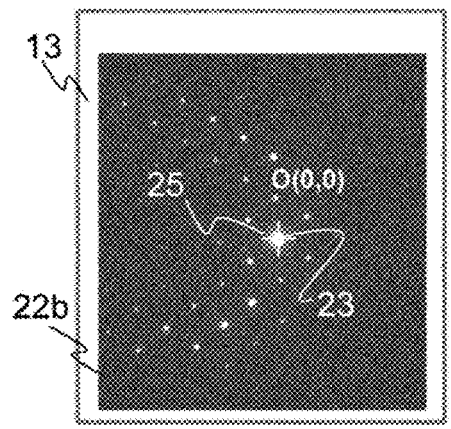
[Fig. 4A]
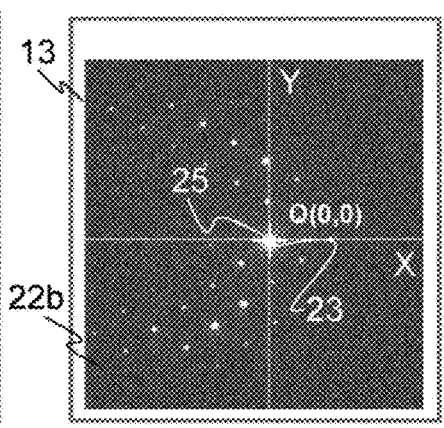
[Fig. 4B]
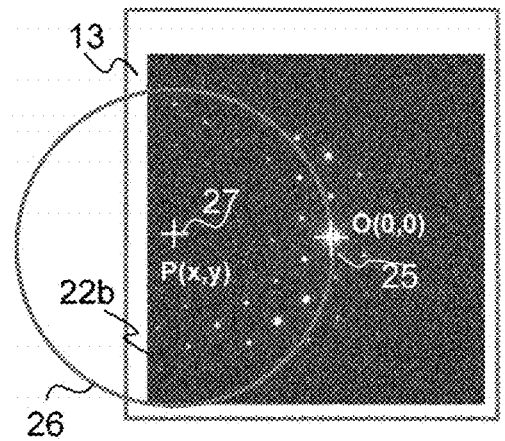
[Fig. 4C]
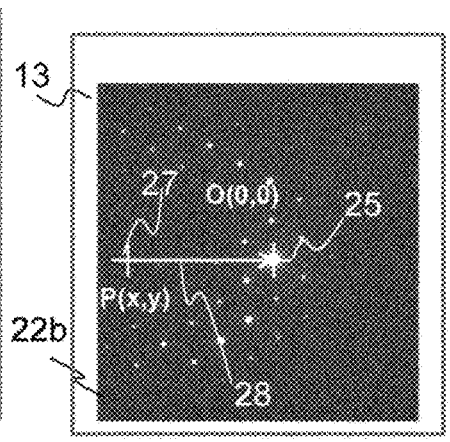
[Fig. 4D]
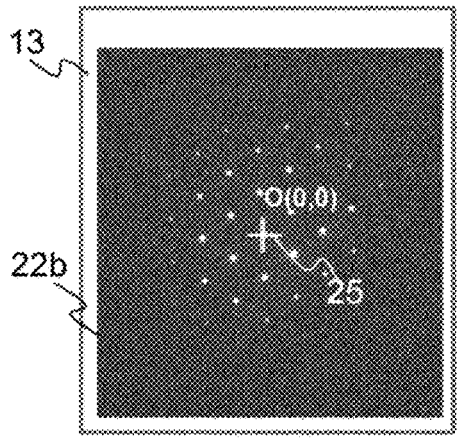
[Fig. 4E]

[Fig. 5]
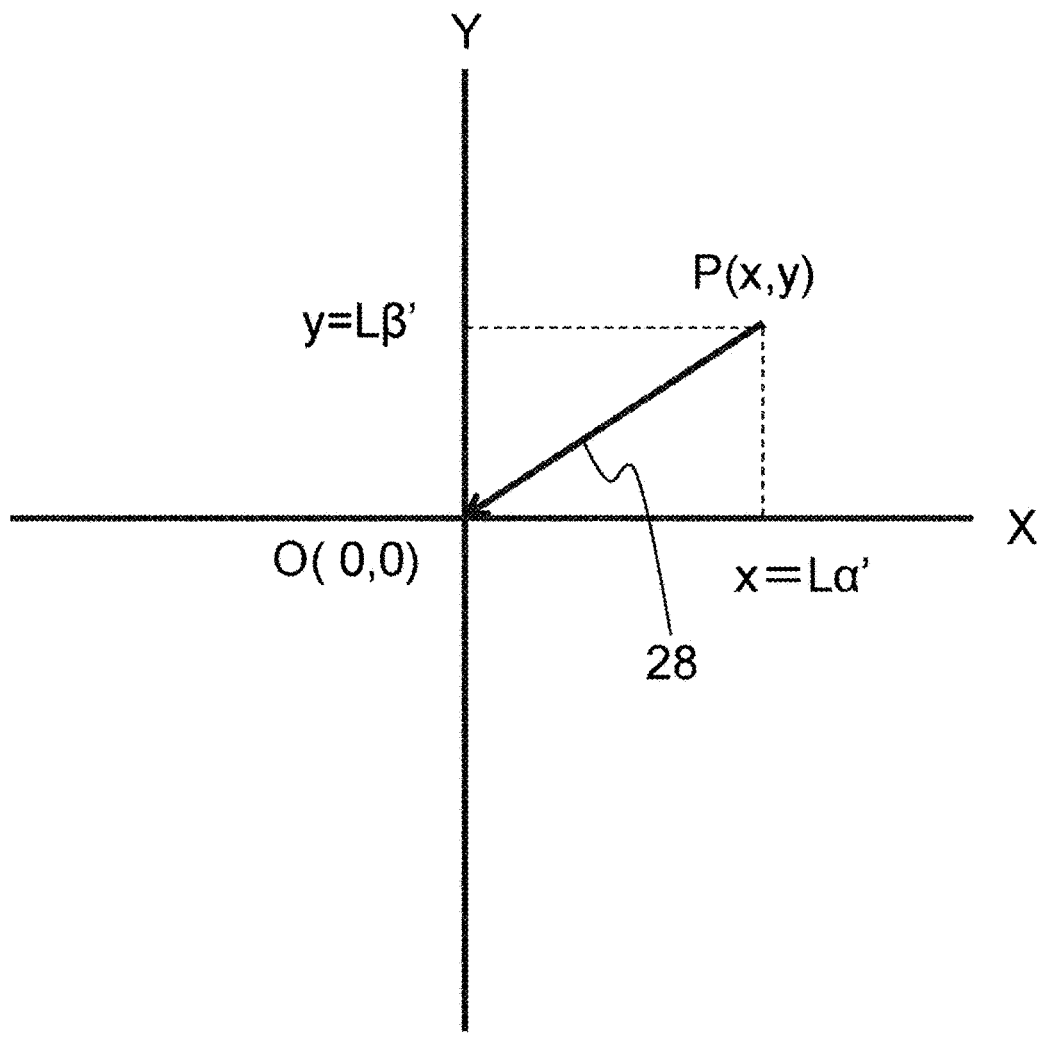

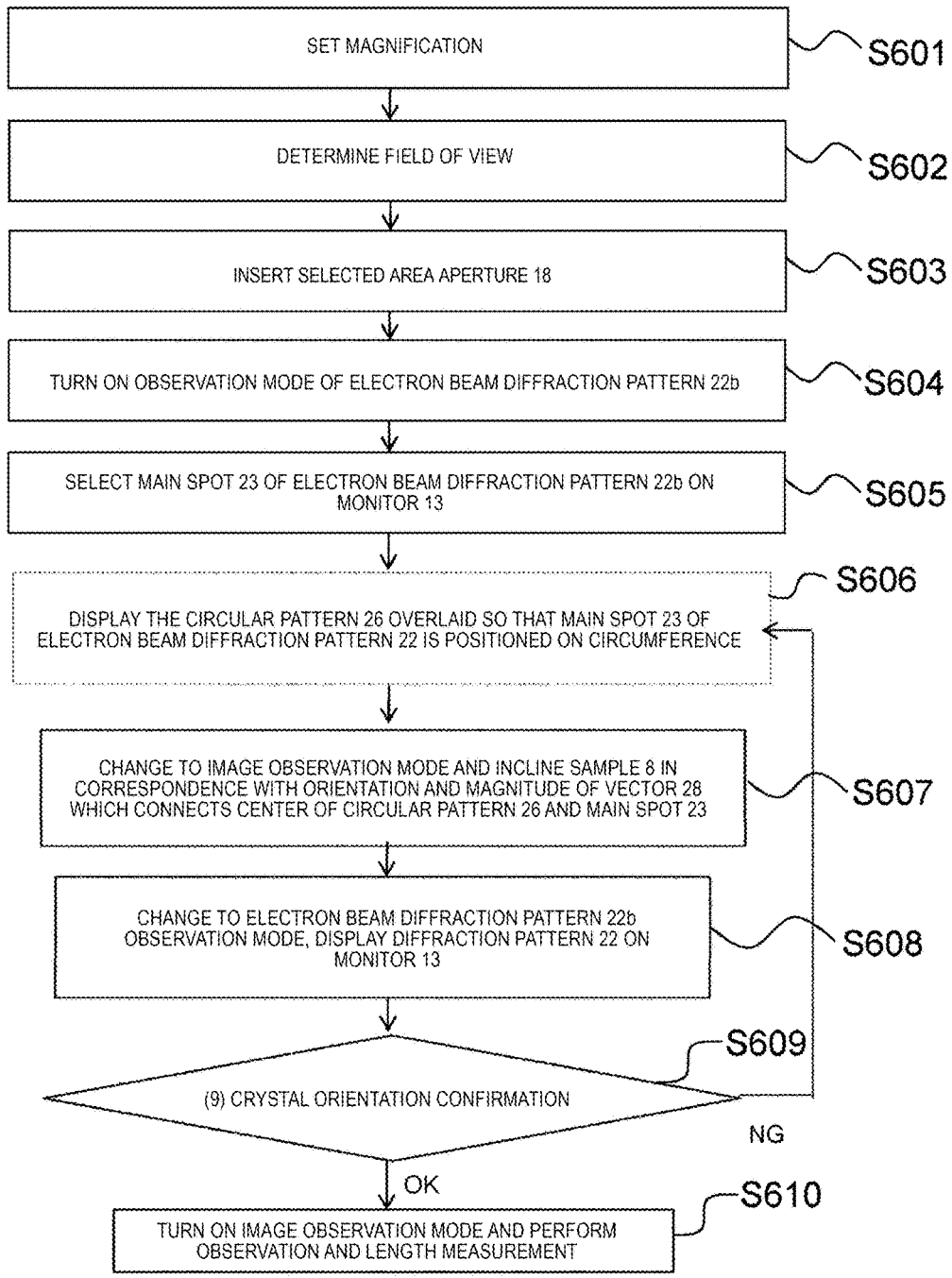
[Fig. 6]

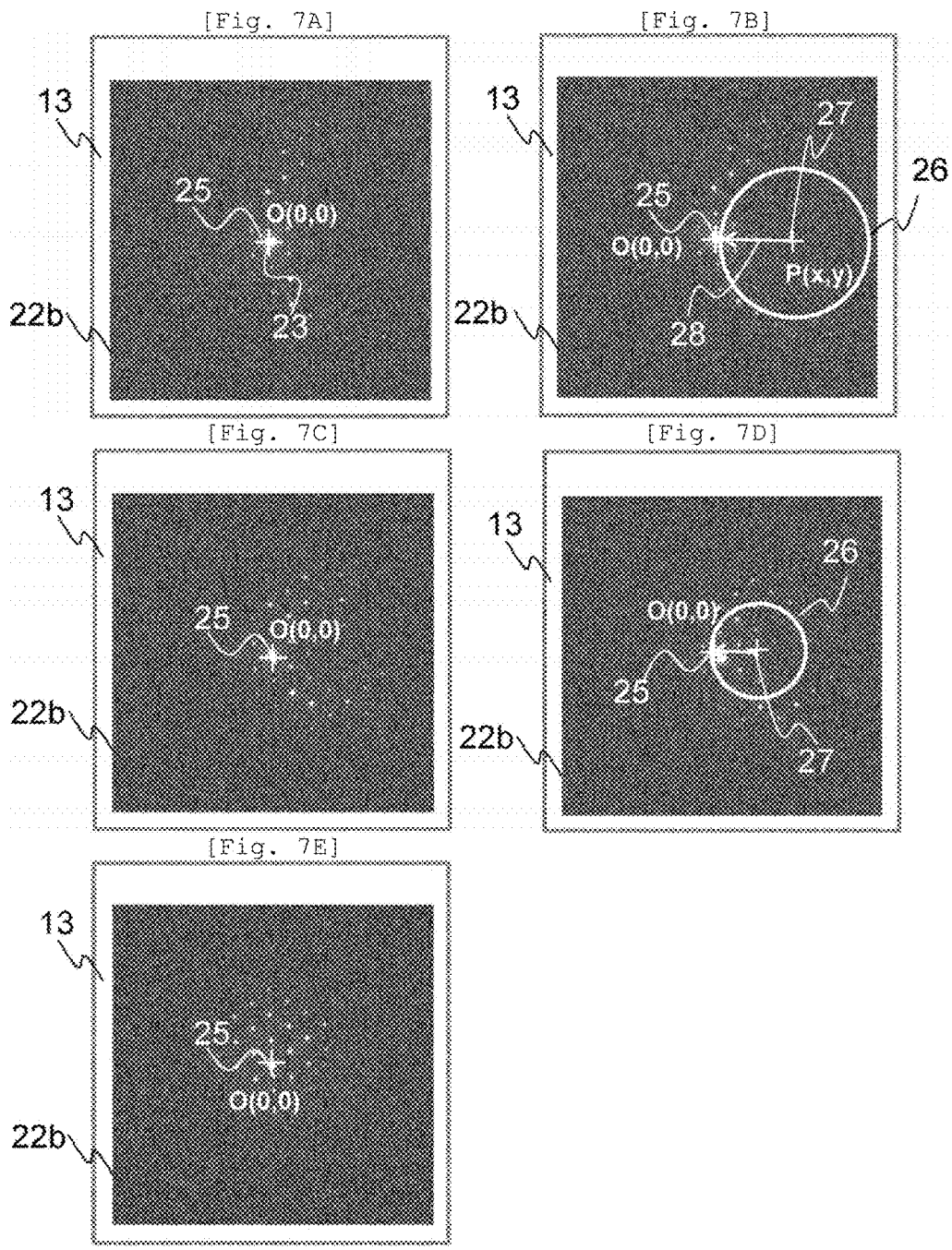

[Fig. 8A]
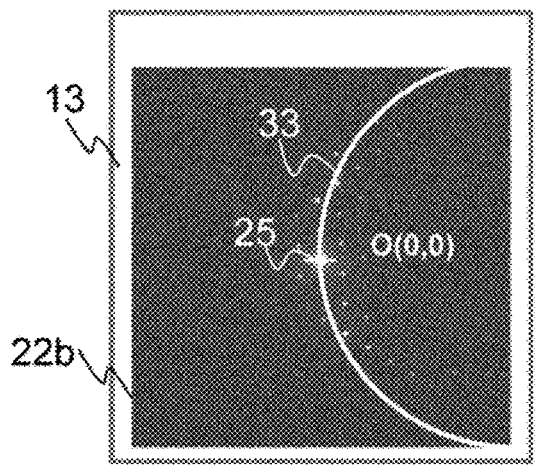
[Fig. 8D]
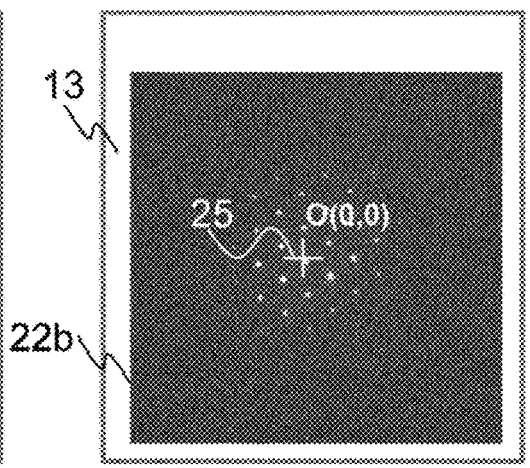
[Fig. 8B]
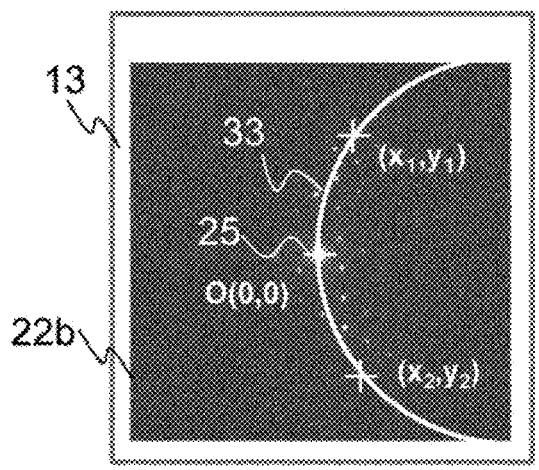
[Fig. 8C]
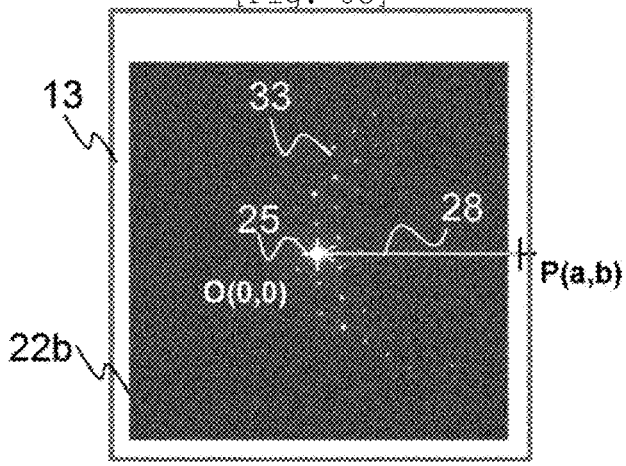

[Fig. 9A]
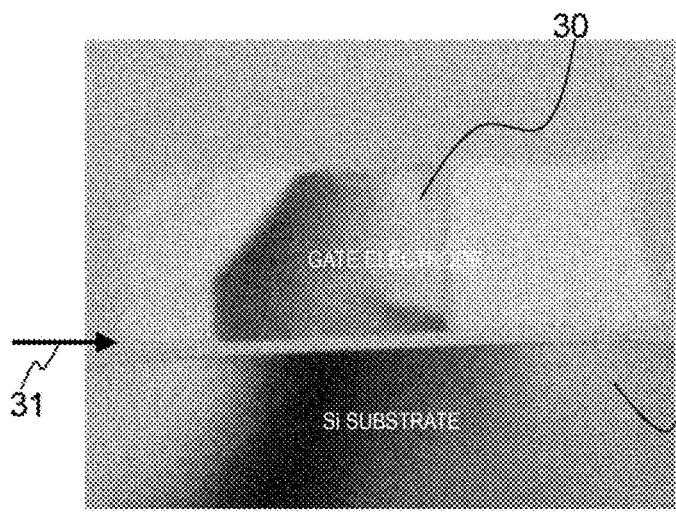
[Fig. 9B]
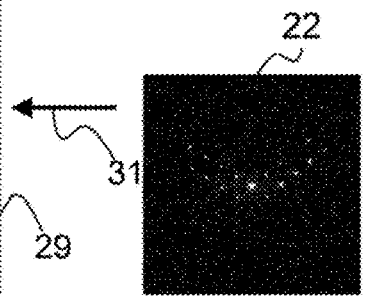
[Fig. 9C]
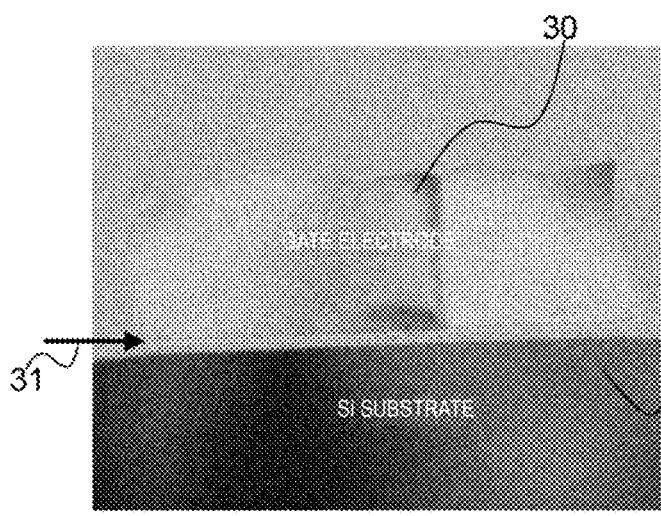
[Fig. 9D]
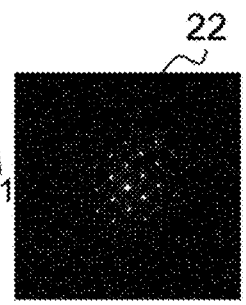

[Fig. 10A]
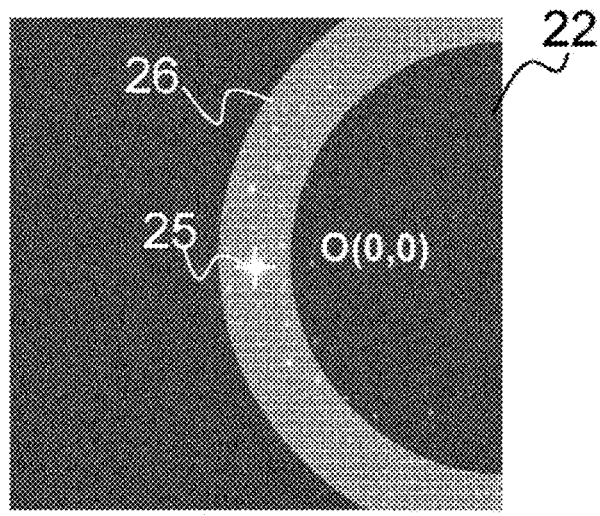
[Fig. 10B]
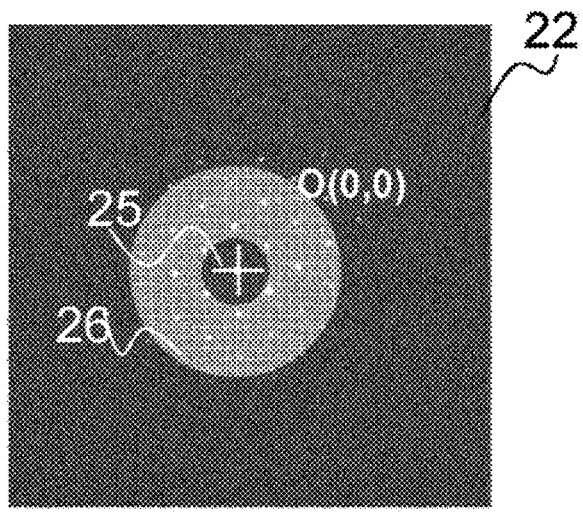

[Fig. 11]
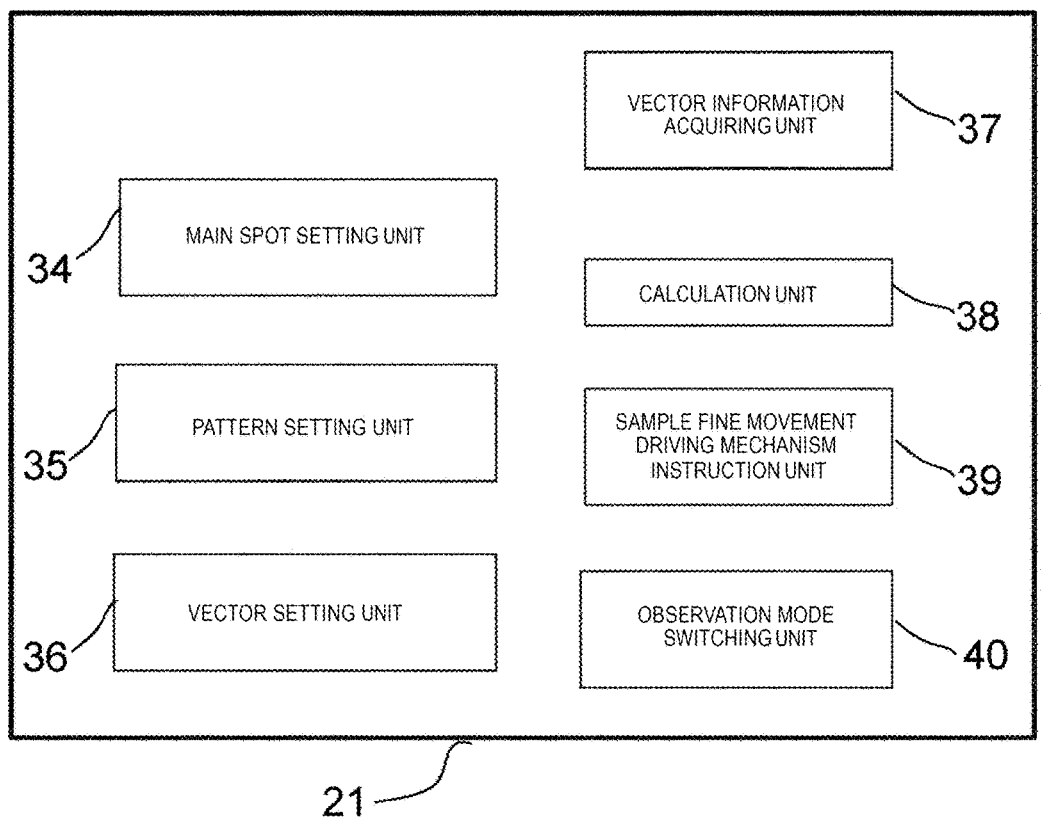

ELECTRON MICROSCOPE AND SAMPLE OBSERVATION METHOD

CROSS REFERENCE TO PRIOR APPLICATIONS

This application is a U.S. National Phase application under 35 U.S.C. §371 of International Application No. PCT/JP2015/066424, filed on Jun. 8, 2015, which claims benefit of priority to Japanese Application No. 2014-139273, filed on Jul. 7, 2014. The International Application was published in Japanese on Jan. 14, 2016 as WO 2016/006375 A1 under PCT Article 21(2). The contents of the above applications are hereby incorporated by reference.

TECHNICAL FIELD

The present invention relates to an electron microscope; and particularly relates to a transmission electron microscope with which it is possible to form, observe, and record a scanning and transmitting electron image and an electron beam diffraction pattern.

BACKGROUND ART

An electron beam diffraction pattern is used for adjusting the crystal orientation of a sample using a transmission electron microscope. Adjusting the electron beam incidence direction and the direction of the crystal axis makes it possible to acquire atomic column information and identify the crystal. In addition, when ascertaining the structure of polycrystalline particles in the vicinity of an interface, it is possible to accurately obtain the particle boundary width or the like by setting a crystalline particle boundary and an electron beam axis in parallel. For example, when evaluating the structure of a semiconductor device, in order to accurately measure the length of structural object which is laminated on a Si substrate, the crystal orientation of the Si substrate is adjusted and the sample is tilted such that electron beams are incident thereto in parallel with the substrate surface.

While the adjustment of the crystal orientation is an essential technique when using a crystalline sample, expertise is required in order to accurately adjust the crystal orientation while observing the electron beam diffraction pattern.

Here, the crystalline sample refers to a sample of which apart or all has an ordering. Examples of samples include single crystals, polycrystals which are complexes of a plurality of fine crystals, or quasicrystals. In addition, compounds which are formed of a single element or a plurality of elements may also be included in the crystalline sample.

In PTL 1, regarding the adjustment of the crystal orientation, electron beam diffraction pattern data which is acquired for each tilting angle of the sample is stored in advance, a distribution of spots of the electron beam diffraction pattern is fitted in a circle based on the stored data, and the sample is automatically tilted such that the radius of the circle is minimized. In addition, for a plurality of electron beam diffraction patterns, a trajectory of a central coordinate of an approximate circle which is determined for each pattern is approximated to a primary function, and a sample tilting angle which is able to obtain an intersection on a primary function straight line at the shortest distance between the primary function straight line and a direct spot central coordinate is determined and set as the optimum tilting angle.

CITATION LIST

Patent Literature

PTL 1: JP-A-2010-212067

SUMMARY OF INVENTION

Technical Problem

However, in the method described in PTL 1, the throughput decreases since it is necessary to store data of an electron diffraction pattern which corresponds to a plurality of different sample tilting angles in advance and a long time is necessary to obtain a crystal zone axis (one crystal axis in common to the collection of surfaces which are referred to as the crystal zone).

In consideration of the problems described above, the present invention has an object of providing an apparatus and a method allowing a crystal orientation to be adjusted with adequate throughput and high precision to observe a sample, regardless of the type of the sample or the crystal orientation, even by non-experts.

Solution to Problem

As an aspect for solving the problem described above, in the present invention, the adjustment of the crystal orientation of the sample includes setting a fitting circular pattern displayed overlaid so that a main spot is positioned on the circumference thereof, on the basis of the diffraction spot brightness distribution in an electron beam diffraction pattern; setting a vector displayed with the starting point at the center position of the displayed circular pattern, and the endpoint at the location of the main spot positioned on the circumference of the circular pattern; and controlling the operation of the sample stage based on the orientation and magnitude of the displayed vector.

Advantageous Effects of Invention

The present invention allows a crystal orientation to be adjusted with adequate throughput and high precision to observe a sample, regardless of the type of the sample or the crystal orientation, even by non-experts.

BRIEF DESCRIPTION OF DRAWINGS

FIG. 1 is a basic configuration diagram of an electron microscope according to the present embodiment.

FIG. 2 is a light path diagram of a transmission electron microscope when observing an electron beam diffraction pattern according to the present embodiment.

FIGS. 3A and 3B are diagrams which show a relationship between a crystalline sample, electron beams, and an electron beam diffraction pattern according to the present embodiment.

FIGS. 4A to 4E are diagrams which illustrate a method for adjusting a crystal orientation according to a first embodiment.

FIG. 5 is a graph which shows an example of rectangular coordinates for determining a tilting direction and angle of the sample according to the present embodiment.

FIG. 6 is a flowchart which shows steps of adjusting the crystal orientation according to the first embodiment.

FIGS. 7A to 7E are diagrams which illustrate a method for adjusting a crystal orientation according to a second embodiment.

FIGS. 8A to 8D are diagrams which illustrate a method for adjusting a crystal orientation according to a third embodiment.

FIGS. 9A to 9D are diagrams which show an example of transmitted electron images and electron beam diffraction patterns before and after adjusting the crystal orientation.

FIGS. 10A and 10B are diagrams which illustrate a method for adjusting a crystal orientation according to a fourth embodiment.

FIG. 11 is a diagram which illustrates a main configuration of a main body control unit which relates to a process of adjusting the crystal orientation according to the present embodiment.

DESCRIPTION OF EMBODIMENTS

First Embodiment

Description will be given below of embodiments of the present invention using the diagrams. Here, description may be omitted by giving the same reference numerals to each of the same configuration parts throughout in each diagram.
Apparatus Configuration FIG. 1 shows the basic configuration of an electron microscope 1 according to the present embodiment. A column of the electron microscope 1 is mainly formed by an electron gun 2, a condenser lens 3, an object lens 4, an intermediate lens 5, and a projection lens 6.

A sample 8 is mounted on a sample holder 7 and the sample holder 7 is introduced through a sample stage 32 which is provided on a side surface of the microscope column of the electron microscope 1 to an inner portion. The movement and tilt of the sample 8 are controlled by a sample fine movement driving mechanism 9 which is connected to the sample stage 32.

A condenser movable aperture 16 for converging electron beams 15 with which the sample 8 is irradiated is arranged on the upper portion of the object lens 4. A diffraction pattern is formed on a back focal plane of the object lens 4, an object movable aperture 17 is provided on the same surface, and a selected area aperture 18 is provided on an image surface. Each of the movable apertures is connected to an aperture driving control unit 19 and able to move in a horizontal direction and the operation thereof is controlled by the aperture driving control unit 19 so as to be adjusted to the observation target and taken in and out on the optical axis.

A fluorescent screen 10 is arranged below the projection lens 6 and a camera 11 is mounted under the fluorescent screen 10. The camera 11 is connected to a monitor 13 and an image analysis apparatus 14 via the camera control unit 12.

Each lens of the condenser lens 3, the objective lens 4, the intermediate lens 5, and the projection lens 6 is connected to a lens power source 20.

The electron beams 15 which are emitted from the electron gun 2 are brought together by the condenser lens 3 and the condenser movable aperture 16 and the sample 8 is irradiated therewith. The electron beams 15 which are transmitted through the sample 8 are imaged by the objective lens 4 and the image thereof is enlarged by the intermediate lens 5 and the projection lens 6 to be projected on the fluorescent screen 10. When the fluorescent screen 10 is moved so as to be shifted from the optical axis, the image is projected on the camera 11 and a transmitted image or an electron beam diffraction pattern 22 is displayed on the monitor 13 and recorded on the image analysis apparatus 14.

A main body control unit 21 is connected to the sample fine movement driving mechanism 9, the camera control unit 12, the aperture driving control unit 19, and the lens power source 20 and sends and receives control signals for controlling the entire apparatus. The sample fine movement driving mechanism 9 is formed by a sample moving mechanism 9a which moves the sample 8 and a sample tilting mechanism 9b which tilts the sample 8. The configuration of the control system shown in FIG. 1 is merely an example and modified examples of the control unit, communication wiring, or the like are included in the scope of the electron microscope of the present embodiment as long as the functions which are intended in the present embodiment are satisfied. For example, in FIG. 1, the main body control unit 21 is connected to each of the constituent unit and controls the entire apparatus; however, it is also possible to form the invention so as to be provided with an independent control unit for each constituent unit.
<Configuration of Main Control Unit>

FIG. 11 is a diagram which, in the configuration included in the main body control unit 21, mainly illustrates constituent unit which relate to adjusting the crystal orientation according to the present embodiment which will be described below. The constituent unit which relate to adjusting the crystal orientation are mainly a main spot setting unit 34, a pattern setting unit 35, a vector setting unit 36, a vector information acquiring unit, a calculation unit 38, a sample fine movement driving mechanism instruction unit 39, and an observation mode switching unit 40. Here, the main body control unit 21 includes various types of constituent unit other than the constituent unit described above.

The main spot setting unit 34 sets a position of the main spot 23 in the electron beam diffraction pattern 22 which is projected on the fluorescent screen 10 or the camera 11 which will be described below. A marker 25 is displayed at the position of the set main spot 23. Here, the setting of the main spot 23 is either able to be selected by an operator or to be automatically determined by an apparatus as will be described below.

The pattern setting unit 35 sets a circular pattern 26 or an circular arced pattern 33 such that the main spot 23 of the electron beam diffraction pattern 22b is positioned on the circumference. In addition, by using the pattern setting unit 35, it is possible to change the shape and size of the circular pattern 26 and the circular arced pattern 33 set based on the brightness distribution of the electron beam diffraction pattern 22b.

After completing the setting of the circular pattern 26 and the circular arced pattern 33, the vector setting unit 36 sets a vector V which has a central point (or a virtual coordinate point of a central point) which will be described below as a starting point and the position of the main spot 23 as the origin.

The vector information acquiring unit 37 acquires information on the orientation and magnitude of the set vector V and determines the tilting direction and the tilting angle of the sample 8 based thereon.

The sample fine movement driving mechanism instruction unit 39 controls an operation of the sample tilting mechanism 9b of the sample fine movement driving mechanism 9 based on the tilting direction and the tilting angle of the sample 8 determined by the calculation unit 38.

The observation mode switching unit 40 is able to change the observation mode of the electron microscope 1 between an image observation mode and an observation mode of the electron beam diffraction pattern 22.

<Optical Path Diagram>

FIG. 2 shows an optical path diagram of the transmission electron microscope 1 when observing the electron beam diffraction pattern 22 according to the present embodiment. The present diagram shows a state when the fluorescent screen 10 is moved to be separated from the optical axis; however, it is also possible to arrange the fluorescent screen 10 on the upper unit of the camera 11. The sample 8 is irradiated with the electron beams 15 in parallel. In a case where the sample 8 is a crystalline sample, the electron beams 15 includes electron beams 15a which move straight forward without being diffracted by the crystal and electron beams 15b which are diffracted, and the electron beams 15b which are diffracted at the same angle are gathered at one point on the back focal plane of the object lens 4 and form an electron beam diffraction pattern 22a on the back focal plane.

The electron beams 15 which form these electron beam diffraction patterns 22a further form an image on an image plane of the object lens 4. The selected area aperture 18 is arranged on the image plane and a region in which an image of the electron beam diffraction pattern 22 is observed is adjusted according to the opening angle of the selected area aperture 18.

When observing the electron beam diffraction pattern 22a, the intermediate lens 5 is focused on the electron beam diffraction pattern 22a which is formed at the back focal plane of the object lens 4, enlarged by the intermediate lens 5 and the projection lens 6, and projected by the fluorescent screen 10 or the camera 11, and the electron beam diffraction pattern 22b after the projection is obtained. In addition, in the image observation mode, the intermediate lens 5 is focused on the image which is imaged on the image plane, enlarged by the intermediate lens 5 and the projection lens 6, and projected by the fluorescent screen 10 or the camera 11.

At this time, the entire field of view is observed by taking the selected area aperture 18 out from the microscope column. In addition, by arranging the selected area aperture 18 in the microscope column and adjusting the divergence angle, the electron beam diffraction pattern 22a which is formed in the field of view which corresponds to the divergence angle in the sample 8 is observed.

FIGS. 3A and 3B show the relationship between the crystalline sample 8, the electron beams 15, and the electron beam diffraction pattern 22a according to the present embodiment. FIG. 3A is a state where the electron beams 15 are incident in parallel with respect to a crystal axis 8a on a crystal plane of the sample 8 and FIG. 3B is a state where the electron beams 15 are incident at an angle of θ from a crystal zone axis with respect to the crystal axis 8a on the crystal-plane of the sample 8. Here, the state where the electron beams 15 are incident in parallel with respect to the crystal axis 8a on the crystal plane of the sample 8 in FIG. 3A is referred to as a state of being incident on the crystal zone axis. From FIG. 3A, a relationship between a diffraction angle θ of the electron beams 15 which are incident to the crystalline sample 8, a distance R from the main spot 23 to a diffraction spot 24, and a camera length L is represented by $$R = L \tan \theta \text{ to } L\theta.$$ [Formula 1]

Here, since L is determined using the crystalline sample 8 which is already known, it is possible to determine the distance R on the plane on which the electron beam diffraction pattern 22a is formed and the angle θ at which the electron beams 15 are incident with respect to the crystal axis 8a on the crystal plane of the sample 8 using Formula (1) by measuring the distance R on the diffraction pattern 22.

FIG. 3B is a case where the sample 8 is tilted at an angle of θ and, as shown in the present diagram, it is understood that it is necessary to tilt the sample 8 at an angle of θ in order to make the electron beams 15 incident in parallel with the crystal axis 8a, that is, incident on the crystal zone axis.

FIGS. 9A to 9D are diagrams which show an example of the transmitted electron image and the electron beam diffraction pattern before and after adjusting the crystal orientation. FIGS. 9A and 9C show a transmitted electron image of which a part of a structure of a Si device is enlarged and FIGS. 9B and 9D show the electron beam diffraction pattern 22b which corresponds to the crystal orientation of a Si substrate 29 of FIGS. 9A and 9C respectively. It is understood from the results of the electron beam diffraction pattern 22b which are shown in FIG. 9B that the electron beams 15 are incident while shifted from the crystal axis of the Si substrate 29 in FIG. 9A. On the other hand, it is understood from the results of the electron beam diffraction pattern 22 which are shown in FIG. 9D that the electron beams 15 in FIG. 9C is in a state of being incident on the crystal axis with respect to the Si substrate 29. When comparing each transmitting electron image of FIGS. 9A and 9C, it is understood that an interface of the Si substrate 29 in FIG. 9C is sharper compared to that in FIG. 9A and that an edge (an arrow portion in the diagram) 31 of a gate electrode 30 which is formed thereon is also sharper. This shows that each of the interfaces is in parallel with respect to the incident electron beams 15 and it is understood that it is necessary for the relationship between the incident electron beams 15 and the sample 8 to be in a state of being incident on the crystal zone axis as shown in FIG. 9C, for example, in order to accurately evaluate the thickness of a gate oxide film between the gate electrode 30 and the Si substrate 29. According to the present embodiment, it is possible to measure the length of the material structural object quickly and accurately since it is possible to easily obtain the conditions of being incident on the crystal zone axis under which it is possible to obtain the transmitted electron image which is shown in FIG. 9C.

FIGS. 4A to 4E are diagrams which illustrate a method for a process of adjusting the crystal orientation according to the first embodiment.

Firstly, the electron beam diffraction pattern 22 is displayed on the monitor 13. When the operator selects, for example, the main spot (direct beams) 23 of the electron beam diffraction pattern 22b after being projected on the fluorescent screen 10 or the camera 11 which is displayed on the monitor 13 by a clicking operation or the like using a mouse, the marker 25 is displayed (a) and the position is set as the origin 0 (0, 0) and X and Y rectangular coordinates which are adjusted to the tilting direction α and β of the sample 8 are obtained (b). Here, an example of displaying the X and Y rectangular coordinates is shown; however, in practice, it is also possible to carry out the process by storing the acquired X and Y rectangular coordinates without displaying them on the monitor 13.

At this time, in a case where the strengths of the main spot 23 and the adjacent diffraction spot are approximately the same, it is difficult to select the main spot 23. In this case, it is possible to determine a position which matches a spot which is stored in advance as the main spot by moving the sample stage 32 to a place at which the sample 8 is not present for the time being, storing the positional information of the illuminated spot, and subsequently moving the sample stage 32 so as to display the electron beam diffraction pattern 22b on the sample 8 after being projected on the fluorescent screen 10 or the camera 11. By doing so, it is possible to select the position of the main spot 23 correctly even in a case where a diffraction spot with approximately the same strength is present at an adjacent position. Here, description is given of a case where the operator selects the position of the main spot 23 in the example described above; however, it is also possible to automatically select the position of the main spot 23 which is stored in advance by the method described above according to the instruction of the main body control unit 21.

Next, when the monitor 13 is clicked, the circular pattern 26 is displayed overlaid so that a main spot 23 of the electron beam diffraction pattern 22b is positioned on the circumference thereof (Step 606). At this time, the operator is able to adjust the size of the circular pattern 26 by adjusting the brightness distribution of the electron beam diffraction pattern 22b.

Here, a second marker 27 is displayed in the center of the circular pattern 26, a coordinate P (x, y) at the position of the second marker 27 on the X and Y rectangular coordinates is stored, and a vector 28 is displayed from the point P to the point 0 (d).

The information of the positions of each of the coordinates of 0 (0, 0) and P (x, y) on the X and Y rectangular coordinates and the information of the size and direction of the vector 28 are sent to the vector information acquiring unit 37 of the main body control unit 21.

Here, as will be described below using FIG. 5, the tilting direction of the sample 8 from the direction of the vector 28 is determined by the calculation unit 38 of the main body control unit 21 and the tilt angle of the sample 8 of the α and β axes is determined using Formula (1) from the size R of the vector 28, that is, from the difference x of the α coordinate and the difference y of the β coordinate.

Based on the determined tilting direction and tilting angle of the sample 8, the main body control unit 21 controls the sample tilting mechanism 9b of the sample fine movement driving mechanism 9 and tilts the sample 8.

Here, when P (x, y) matches 0 (0, 0), the electron beams 15 are incident on the crystal zone axis. In addition, switching to the image observation mode, when tilting the sample 8, makes it possible to confirm the size of the field of view which is limited by the selected area aperture 18. Even in a case where a field of view movement occurs due to the tilting of the sample 8, it is possible to prevent the field of view from being lost when tilting the sample 8 by adjusting the fine movement of the sample or the like by operating the sample moving mechanism 9a of the sample fine movement driving mechanism 9 either by manual operation of the operator or by automatic operation of the main body control unit 21. In the method of correcting positional shifting by determining the adjustment amount of the field of view movement based on the relationship between the tilting angle and the amount of positional shifting which are acquired in advance or based on a correction calculation formula, there are cases where it is not possible to adjust to the actual position of the sample 8 depending on the reproducibility or precision of the sample stage; however, it is possible to execute reliable correction of the positional shifting by adjusting the field of view movement in real time when observing the image in the image observation mode in this manner.

FIG. 5 is a graph which shows the X and Y rectangular coordinates which are used for obtaining the tilting direction and tilting angle of the sample 8 according to the present embodiment. The horizontal axis is an X axis which corresponds to the α axis of the sample tilting axis, the vertical axis is a Y axis which corresponds to the β axis of the sample tilting axis, and the position of the main spot 23 of the electron beam diffraction pattern 22 is set to be the origin 0 (0, 0). In addition, the central point of the circular pattern 26 which is displayed overlaid by adjusting to the brightness distribution of the electron beam diffraction pattern 22 is set to be P (x, y). The tilting angle and direction of the sample 8 are calculated from the vector 28 from the point P to the point 0. In this case, the α component of the tilting angle is $\alpha'=-x/L$ from Formula (1) and the β component is $\beta'=-y/L$.

FIG. 6 is a flowchart which shows operation steps of adjusting the crystal orientation according to the first embodiment.

Firstly, the magnification is set (Step 601). At this time, it is desirable to set the magnification to an appropriate level or less in order to make tracking easy even when the field of view moves when tilting the sample 8.

Next, in order to determine the restricted field of view, the field of view on the sample 8 for adjusting the crystal orientation is determined using the sample moving mechanism 9a and the sample tilting mechanism 9b of the sample fine movement driving mechanism 9 (Step 602).

After that, the selected area aperture 18 is inserted using the aperture driving mechanism 19 with respect to the sample 8 on which the crystal orientation adjustment is performed (Step 603).

Here, the observation mode of the electron beam diffraction pattern 22 is turned on (Step 604). Due to this, the lens power source 20 of the intermediate lens 5 and the projection lens 6 is controlled from the main body control unit 21 so that the intermediate lens 5 is focused on the electron beam diffraction pattern 22a which is formed at the back focal plane of the objective lens 4, the electron beam diffraction pattern 22 is enlarged and projected on the fluorescent screen 10 or the camera 11 by the intermediate lens 5 and the projection lens 6. Due to this, the electron beam diffraction pattern 22b after being projected on the fluorescent screen 10 or the camera 11 is obtained. Due to the control of the main body control unit 21, the electron beam diffraction pattern 22b which is projected on the fluorescent screen 10 or the camera 11 is displayed on the monitor 13 via the camera control unit 12.

Next, by the operator selecting the main spot (direct beams) 23 of the electron beam diffraction pattern 22b which is displayed on the monitor 13 by a clicking operation or the like via an input apparatus such as a mouse, the position of the main spot 23 is displayed by the main spot setting unit 34 of the main body control unit 21 (Step 605).

At this time, it is difficult to select the main spot 23 in a case where the strengths of the main spot 23 and the adjacent diffraction spot are approximately the same. In this case, it is possible to determine a position which matches a position stored in advance as the main spot 23 by moving the sample stage 32 to a place in which the sample 8 is not present for the time being, storing the positional information of the illuminated spot, and subsequently moving the sample stage 32 so as to display the electron beam diffraction pattern 22 on the sample 8. By doing so, it is possible to select the main spot 23 correctly even in a case where a diffraction spot with approximately the same strength is present at an adjacent position. Here, description is given of a case where the operator selects the main spot in the example described above; however, it is also possible to automatically select the main spot according to the instruction of the main body control unit 21.

Next, by clicking on the monitor 13, the circular pattern 26 is displayed overlaid so that a main spot 23 is positioned on the circumference thereof via the pattern setting unit 35 of the main body control unit 21 (Step 606). At this time, it is possible to adjust the size of the circular pattern 26 to match the brightness distribution of the electron beam diffraction pattern 22b. Here, the pattern setting unit 35 of the main body control unit 21 is able to display the circular pattern 26 so as to be arranged in the brightness distribution of the diffraction spot of the electron beam diffraction pattern 22b.

Due to this, the circular pattern 26 and the central point (the starting point of the vector) P (x, y) are determined and a vector V28 which connects the central point P (x, y) of the circular pattern 26 and the origin (the end point of the vector) 0 (0, 0) which is the position of the main spot 23 is displayed.

Next, when the monitor 13 is clicked, the sample 8 is tilted in correspondence with the orientation and magnitude (length) of the vector 28 (Step 607). Here, since the information of the position of each of the coordinates of 0 (0, 0) and P (x, y) on the X and Y rectangular coordinates and the information of the size and direction of the vector 28 are sent to the vector information acquiring unit 37 of the main body control unit 21 and the tilting direction and tilt angle of the sample 8 are determined by the calculation unit 38, the sample 8 is tilted via the sample fine movement driving mechanism instruction portion 39 based on the determined results.

At the same time as the tilting of the sample 8 starts, the electron microscope 1 is changed to the image observation mode by the observation mode switching unit 40 of the main body control unit 21 and the image when tilting the sample 8 is displayed on the monitor 13. At this time, even in a case where a field of view movement occurs due to the tilting of the sample 8, it is possible to prevent the field of view from being lost when tilting the sample 8 by adjusting the fine movement of the sample or the like by operating the sample moving mechanism 9a of the sample fine movement driving mechanism 9 either by manual operation of the operator or the automatic operation of the main body control unit 21. In the method of correcting positional shifting by determining the adjustment amount of the field of view movement based on the relationship between the tilting angle and the amount of positional shifting which are acquired in advance or based on a correction calculation formula, there are cases where it is not possible to adjust to the actual position of the sample 8 depending on the reproducibility or precision of the sample stage; however, it is possible to execute reliable correction of the positional shifting by adjusting the field of view movement in real time when observing the image in the image observation mode in this manner. In addition, apart from the adjustment of fine movement of the sample, it is also possible to adjust the field of view movement by changing the irradiation region of the electron beams 15 by controlling a tilting device which is not shown in the diagram.

When the operation of tilting the sample 8 is completed, the mode is changed to the observation mode of the electron beam diffraction pattern 22b by the observation mode switching unit 40 of the main body control unit 21, and the electron beam diffraction pattern 22b is displayed on the monitor 13 (Step 608).

Next, the results of adjusting the crystal orientation of the displayed electron beam diffraction pattern 22 are confirmed (Step 609). Here, in a case where shifting remains between the central point P (x, y) of the circular pattern 26 and the origin 0 (0, 0) which is the position of the main spot 23 of the electron beam diffraction pattern 22b, the operations from Step 608 to Step 609 are further repeated.

When the center of the circular pattern 26 and the main spot 23 of the electron beam diffraction pattern 22b are overlaid, the crystal orientation adjustment is finished, the image observation mode is turned on, and the observation and length measurement of the sample 8 are performed (Step 610).

Here, in Step 607 described above, when carrying out correction in a case where a field of view movement occurs when tilting the sample 8, it is desirable for the correction to handle the switching to the image mode. At this time, in a case where, for example, the selected area aperture 18 is small and it is difficult to confirm the movement only with the field of view which is included in the aperture, the entire field of view is displayed by taking out the selected area aperture 18 in synchronization with the switching to the image mode, and, after correcting the field of view movement, the aperture driving mechanism 19 may be driven such that the selected area aperture 18 is introduced again when switching to the observation mode of the electron beam diffraction pattern 22b. In addition, in a case where a field of view movement does not occur when tilting the sample 8, it is possible to omit the switching to the image mode.

(Second Embodiment)

FIGS. 7A to 7E are diagrams which illustrate the operation of adjusting the crystal orientation according to the present embodiment.

Circular Pattern

In the example in FIGS. 4A to 4E described above in the first embodiment, description is given of the method of fitting the brightness distribution of the diffraction pattern 22 and the size of the circular pattern 26. However, in a case where the crystal orientation is greatly shifted from the incident crystal zone axis when starting the observation of the diffraction pattern 22, there are times when fitting using the circular pattern 26 is difficult by the method described above.

Thus, in the second embodiment, the main spot 23 is firstly assigned as the origin 0 (0, 0) by a cursor 25 (a) and subsequently displayed overlaid such that the circumference of the displayed circular pattern 26 always passes through the main spot 23, that is, the cursor 25, in the diffraction spots of the electron beam diffraction pattern 22b, that is, a region in which there is a large amount of brightness distribution (b). At this time, it is possible to set the crystal orientation to be incident on the crystal zone axis by determining the tilt angle of the sample 8 based on the vector 28 which connects the marker 27 which is displayed as the central point P (x, y) of the circular pattern 26 and the main spot 23, that is, the marker 25, displaying the above as the circular pattern 26 again, repeating the same operations (c, d), and eventually matching the coordinates of the central point P (x, y) of the circular pattern 26 and the origin 0 (0, 0) which is the main spot 23. According to the method described above, it is necessary to repeat the operation of tilting the sample 8 a plurality of times; however, even when the crystal orientation is greatly shifted from being incident on the crystal zone axis when starting the observation, it is possible to easily adjust the crystal orientation.

(Third Embodiment)

FIG. 8 is a diagram which shows a method of adjusting the crystal orientation according to the third embodiment. In the present embodiment, description will be given of a method for performing fitting using a circular arced pattern (a part of the circumference) 33 instead of the circular pattern 26 described above.

In a case where the crystal orientation is greatly shifted from being incident on the crystal zone axis when starting the observation of the electron beam diffraction pattern 22b, an option marker 25 is firstly displayed with the main spot 23 as the origin 0 (0, 0) (a). Next, the circular arced pattern 33 is displayed so as to pass through the origin 0 (0, 0) which is the main spot 23, that is, the marker 25, and fit in the brightness distribution of the electron beam diffraction pattern 22b (b). Optional coordinates (x1, y1) and (x2, y2) of two points on the fitted circular arced pattern 33 are displayed and recorded (c). The fitted circular arced pattern 33 is a part of the circumference of the circular pattern 26 and it is possible to determine the virtual coordinate point P (a, b) of the central point of the circular pattern 26 by the simultaneous equations (2-1, 2-2, and 2-3) below when the virtual radius of the circular pattern 26 is r.

$$a^2+b^2=r^2 \quad \text{Equation 2-1}$$

$$(x_1-1)^2+(y_1-b)^2=r^2 \quad \text{Equation 2-2}$$

$$(x_2-a)^2+(y_2-b)^2=r^2 \quad \text{Equation 2-3}$$

The vector 28 from the virtual coordinate point P (a, b) of the central point to the origin 0 (0, 0), that is, the marker 25, is obtained from the results which are determined from the equations described above and it is possible to carry out adjustment so as to be incident on the crystal zone axis (d) by determining the amount of tilting and the direction of the corresponding sample 8, tilting the sample 8 by the sample tilting mechanism 9b of the sample fine movement driving mechanism 9, and adjusting the crystal orientation.

According to the present embodiment, even in a case where the incidence of the electron beams 15 is greatly shifted from the crystal zone axis and fitting using the circular pattern 26 is difficult, it is possible to adjust the crystal orientation by obtaining the virtual coordinate point of the central point using the circular arced pattern 33.

(Fourth Embodiment)

FIG. 10 are diagrams which illustrate an operation according to the fourth embodiment. FIG. 10A shows the electron beam diffraction pattern 22b in a case where the crystal orientation is shifted from the crystal zone axis with respect to the incident axis of the electron beams 15 and FIG. 10B shows the electron beam diffraction pattern 22b in a state where the crystal orientation matches the crystal zone axis with respect to the incident axis of the electron beams 15, that is, in a state of being incident on the crystal zone axis. In the present embodiment, the circumference of the circular pattern 26 which is fitted in the diffraction spot is displayed not as a line but a marker in a semi-transparent strip form with an optional width. Due to this, even when displayed as overlapping on the diffraction spot, it is possible to confirm the position of the diffraction spot. Therefore, compared to the embodiments described above, it is possible to perform the fitting to the diffraction spot more easily.

REFERENCE SIGNS LIST

1 ELECTRON MICROSCOPE
2 ELECTRON GUN
3 CONDENSER LENS
4 OBJECTIVE LENS
5 INTERMEDIATE LENS
6 PROJECTION LENS
7 SAMPLE HOLDER
8 SAMPLE
8 CRYSTAL AXIS
9 SAMPLE FINE MOVEMENT DRIVING MECHANISM
9a SAMPLE MOVING MECHANISM
9b SAMPLE TILTING MECHANISM
10 FLUORESCENT SCREEN
11 CAMERA
12 CAMERA CONTROL PORTION
13 MONITOR
14 IMAGE ANALYSIS PORTION
15 ELECTRON BEAM
16 CONDENSER MOVABLE APERTURE
17 OBJECTIVE MOVABLE APERTURE
18 SELECTED AREA APERTURE
19 APERTURE DRIVING CONTROL MECHANISM
20 LENS POWER (SOURCE)
21 MAIN BODY CONTROL UNIT
22a ELECTRON BEAM DIFFRACTION PATTERN
22b ELECTRON BEAM DIFFRACTION PATTERN AFTER PROJECTION TO FLUORESCENT SCREEN OR CAMERA
23 MAIN SPOT
24 DIFFRACTION SPOT
25 MARKER
26 CIRCULAR PATTERN
27 MARKER
28 VECTOR
29 Si SUBSTRATE
30 GATE ELECTRODE
31 GATE ELECTRODE EDGE
32 SAMPLE STAGE
33 CIRCULAR ARCED PATTERN (PART OF CIRCUMFERENCE)
34 MAIN SPOT SETTING UNIT
35 PATTERN SETTING UNIT
36 VECTOR SETTING UNIT
37 VECTOR INFORMATION ACQUIRING UNIT
38 CALCULATION UNIT
39 SAMPLE FINE MOVEMENT DRIVING MECHANISM INSTRUCTION UNIT
40 OBSERVATION MODE SWITCHING UNIT

The invention claimed is:

1. An electron microscope comprising:
an electron source with electron beams which irradiate a sample;
a sample stage which holds the sample;
a driving unit which drives the sample stage;
a detecting unit which acquires a signal which is obtained from the sample by irradiation of the electron beams and detects a sample image;
a display unit which displays an electron beam diffraction image of the sample; and
a control unit,
wherein the control unit has
a pattern setting unit that sets a circular pattern for fitting which is displayed overlaid so that a main spot is positioned on a circumference thereof, based on a diffraction spot brightness distribution in an electron beam diffraction pattern displayed on a display unit, and
a vector setting unit which sets a vector displayed with a starting point at a center position of the displayed circular pattern, and an end point at a location of the main spot positioned on the circumference of the circular pattern, and wherein the control unit controls the driving unit so as to tilt the sample based on an orientation and magnitude of the displayed vector.

2. The electron microscope according to claim 1, wherein the pattern setting unit sets the circular pattern for fitting so as to be displayed in a region in which there is a brightness distribution.

3. The electron microscope according to claim 1, wherein the pattern setting unit changes a size of the circular pattern.

4. The electron microscope according to claim 1, wherein the control unit determines a tilting direction of the sample based on the orientation of the vector which is set by the vector setting unit and determines a tilting angle of the sample based on the magnitude of the vector.

5. The electron microscope according to claim 1, wherein the control unit switches an observation mode so as to display the sample image which is detected by the detecting unit on the display unit when tilting the sample.

6. The electron microscope according to claim 1, further comprising:

a tilting device which tilts the region which is irradiated with the electron beams, wherein the control unit controls the tilting device so as to correct field of view shifting which is generated when tilting the sample.

7. The electron microscope according to claim 1, wherein the pattern setting unit sets, a circular arced pattern for fitting which forms a part of the circumference of the circular pattern which is displayed overlaid so that a main spot is positioned on the circumference thereof, on the basis of the diffraction spot brightness distribution in an electron beam diffraction pattern displayed on a display unit, and the vector setting unit determines a radius of the circular pattern based on coordinates of two optional points on the circumference of the displayed circular arced pattern, sets a center position of the circular pattern based on the determined radius, and sets a vector displayed with the starting point at the set center position of the displayed circular pattern, and the end point at the location of the main spot positioned on the circumference of the circular pattern.

8. The electron microscope according to claim 1, wherein the pattern setting unit sets the circular pattern for fitting in a semi-transparent band form.

9. A method for observing a sample using an electron microscope, the method comprising:

irradiating a sample with electron beams using an electron source;

holding the sample using a sample stage;

driving the sample stage using a driving unit;

detecting a sample image by acquiring a signal which is obtained from the sample by irradiation of the electron beams, using a detecting unit;

displaying an electron beam diffraction image of the sample using a display unit; and the method comprising a control unit configured to perform the following steps:

a step of setting a circular pattern for fitting which is displayed overlaid so that a main spot is positioned on a circumference thereof, based on a diffraction spot brightness distribution in an electron beam diffraction pattern displayed on a display unit;

a step of setting a vector displayed with a starting point at a center position of the displayed circular pattern, and an end point at a location of the main spot positioned on the circumference of the circular pattern; and a step of tilting the sample based on an orientation and magnitude of the displayed vector.

* * * * *